United States Patent
Jairazbhoy et al.

(10) Patent No.: US 6,316,736 B1
(45) Date of Patent: *Nov. 13, 2001

(54) ANTI-BRIDGING SOLDER BALL COLLECTION ZONES

(75) Inventors: Vivek Amir Jairazbhoy, Farmington Hills; Richard Keith McMillan, Dearborn, both of MI (US)

(73) Assignee: Visteon Global Technologies, Inc., Dearborn, MI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,821

(22) Filed: Jun. 8, 1998

(51) Int. Cl.[7] ........................................... H01R 9/09
(52) U.S. Cl. ..................... 174/260; 174/250; 361/760; 361/777; 228/180.21
(58) Field of Search .................... 174/250, 260; 361/760, 777; 228/180.21

(56) References Cited

U.S. PATENT DOCUMENTS

| | | |
|---|---|---|
| 3,339,008 | 8/1967 | MacArthur et al. . |
| 4,208,563 | 6/1980 | Frantzreb, Sr. et al. . |
| 4,918,277 | 4/1990 | Zimmer . |
| 5,024,372 | 6/1991 | Altman et al. . |
| 5,242,100 | 9/1993 | Weeks . |
| 5,386,087 | 1/1995 | Lee et al. . |
| 5,453,581 | 9/1995 | Liebman et al. . |
| 5,620,131 | 4/1997 | Kane et al. . |
| 5,644,475 | 7/1997 | Woychik et al. . |

FOREIGN PATENT DOCUMENTS

| | | | |
|---|---|---|---|
| 4-255291 | * | 9/1992 | (JP) . |
| 5-121868 | * | 5/1993 | (JP) . |
| 5-291736 | * | 11/1993 | (JP) . |
| 6-61604 | * | 3/1994 | (JP) . |
| 8-264928 | * | 10/1996 | (JP) . |
| 8-288628 | * | 11/1996 | (JP) . |

* cited by examiner

*Primary Examiner*—Albert W. Paladini
(74) *Attorney, Agent, or Firm*—Larry I. Shelton

(57) ABSTRACT

There is disclosed herein a printed circuit board (PCB) having improved resistance against solder bridging and component decentering/tombstoning. The printed circuit board (PCB) includes a substrate 10 having a top surface 12; at least two mounting pads 14 disposed on the top surface in matched relation with terminations 26 of an electronic component 24; and a solder mask 16 disposed on the top surface and having at least two apertures 18 therethrough, wherein each aperture generally conforms in shape with and is arranged about a respective one of the mounting pads 14. Each aperture 18 has at least one inner aperture edge 22*i* generally within a projected footprint F of the electronic component and at least one outer aperture edge 22*o* generally outside the footprint F. Each aperture 18 includes a notch 20 in one or more of the at least one outer aperture edge 22*o*, wherein each notch 20 extends generally outward from its respective mounting pad 14. The notch 20 provides a reservoir in the solder mask aperture 18 about each pad 14, into which flux, other solder paste effluents, and solder balls may be channeled and remain contained.

20 Claims, 4 Drawing Sheets

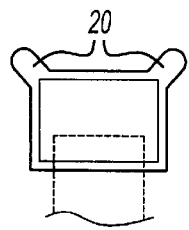
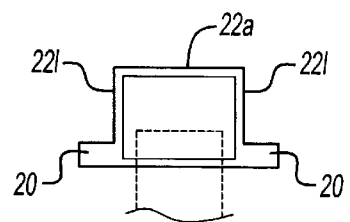
*Fig-7Q*　　　　*Fig-7R*
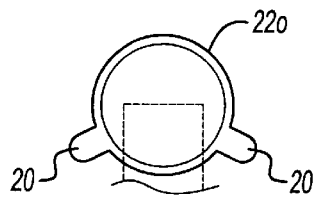
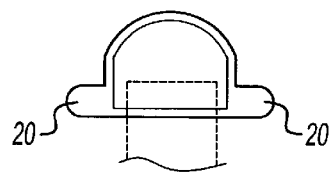
*Fig-7S*　　　　*Fig-7T*
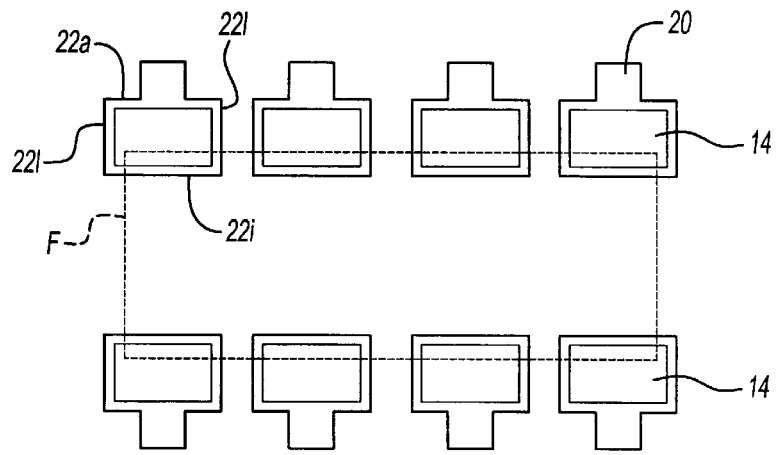
*Fig-8*
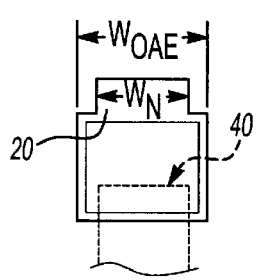
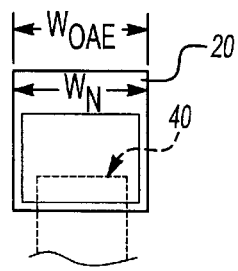
*Fig-9A*　　　　*Fig-9B*

ANTI-BRIDGING SOLDER BALL COLLECTION ZONES

BACKGROUND OF THE INVENTION

1. Field of the Invention

The present invention relates generally to printed circuit boards, and more particularly to a printed circuit board having improved resistance against solder bridging and component decentering/tombstoning.

2. Disclosure Information

A conventional printed circuit board (PCB) generally includes a substrate 10 with conductive circuit traces 30 and mounting pads 14 thereon, as shown in FIGS. 1–3. Once the traces and pads have been disposed on the substrate, a thin, solder-resistant layer of material, often called a "solder mask" 16, is applied to the surface of the PCB. Typically the solder mask covers substantially all of the circuit traces, but not the mounting pads; this is accomplished by forming apertures 18 in the solder mask wherein each aperture generally conforms in shape with and is situated concentrically about a respective mounting pad. For example, if a given mounting pad is rectangular, its corresponding solder mask aperture will likewise be rectangular, with the edges 22 of the aperture evenly spaced apart from the corresponding edges 28 of the mounting pad by a given amount or gap P. This gap P between the mounting pad edges 28 and aperture edges 22 is referred to as "solder mask pullback"; for screenprinting, the pullback P is typically about 10–20 mils, whereas for liquid photoimageable solder mask (LPISM) the pullback P is typically 0–5 mils. As illustrated in FIGS. 1–3, this pullback of the mask from the mounting pad creates a "trough" 32 about each pad.

After the solder mask is applied to the PCB surface, the mounting pads and any other circuit structures exposed through the apertures may be tinned, followed by solder paste being applied thereto, typically by screen-printing or deposition. Solder paste is typically a slurry of metallic solder particles (e.g., eutectic tin/lead), flux, and other components. After the paste has been printed/deposited, and the PCB has been populated by placing electronic components thereon with the component terminations atop their corresponding mounting pads, the populated PCB is subjected to reflow processing.

During reflow, the metallic component of the solder paste melts and forms solder joints, while the flux and other effluent components of the paste are liberated and often flow across the solder mask surface about each solder joint. Various gases and vapors are also ejected from the molten paste during reflow and solidification. It is well known that when flux and other effluents flow across the solder mask, they provide solder-wettable paths along which solder balls may be transported. This presents a serious problem, because these migratory solder balls may end up solidifying in such a way as to short out two or more adjacent mounting pads; or, enough of the solder or paste may be wicked away from a pad such that the solder that is left thereon is insufficient to form an acceptable joint (or any appreciable joint at all), resulting in an open circuit, or a weak joint if one forms at all. Additionally, if flux or other effluents wick up underneath the component 24, the component may "skate" or "float" on the flux/effluents and become unacceptably decentered with respect to the mounting pads. Furthermore, gases escaping from any paste which wicks up under a component may escape so violently as to promote or worsen the tendency for the component to decenter or tombstone.

Therefore, it would be advantageous to provide a way of channeling away and containing the flux and other effluents liberated during reflow, in order to preclude the flux/effluents from promoting or exacerbating the aforementioned problems of solder ball migration and component decentering and tombstoning.

SUMMARY OF THE INVENTION

The present invention overcomes the disadvantages of prior art approaches by providing a PCB having improved resistance against solder bridging and component decentering/tombstoning. The PCB comprises: (a) a substrate having a top surface; (b) at least two mounting pads disposed on the top surface in matched relation with terminations of an electronic component; and (c) a solder mask disposed on the top surface and having at least two apertures therethrough, wherein each aperture generally conforms in shape with and is arranged about a respective one of the mounting pads. Each aperture has at least one inner aperture edge generally within a projected footprint of the electronic component and at least one outer aperture edge generally outside the footprint. Each aperture includes a notch in one or more of the at least one outer aperture edge, wherein each notch extends generally outward from its respective mounting pad.

It is an object and advantage of the present invention that the solder mask aperture notches provide a reservoir into which solder paste effluents (such as flux) may flow during reflow. This facilitates the collection and containment of effluents and/or solder balls during reflow, thereby reducing the tendency to form effluent/flux paths across the solder mask surface along which solder balls could migrate to form solder bridges.

Another advantage is that the present invention acts to prevent flux/effluents/solder balls from wicking underneath the component during reflow, thus minimizing or eliminating the tendency toward component decentering and tombstoning.

Yet another advantage is that the solder mask notches of the present invention are easy and inexpensive to implement, and may be used compatibly and beneficially with existing solder mask/PCB technology.

These and other advantages, features and objects of the invention will become apparent from the drawings, detailed description and claims which follow.

BRIEF DESCRIPTION OF THE DRAWINGS

FIG. 8 is a plan view of a mounting pad/solder mask configuration for an 8-pin SOIC (small outline integrated circuit) according to the present invention.

FIGS. 9A–B are plan views of non-recommended mounting pad/solder mask notch configurations.

DETAILED DESCRIPTION OF THE PREFERRED EMBODIMENTS

Figure 1:
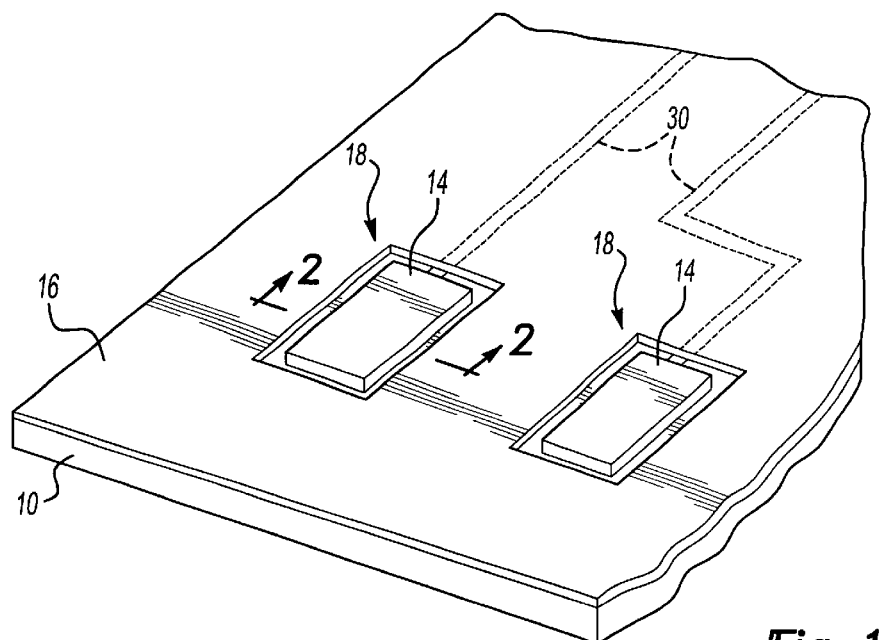
FIG. 1 is a perspective view of a PCB according to the prior art.
Figure 2:
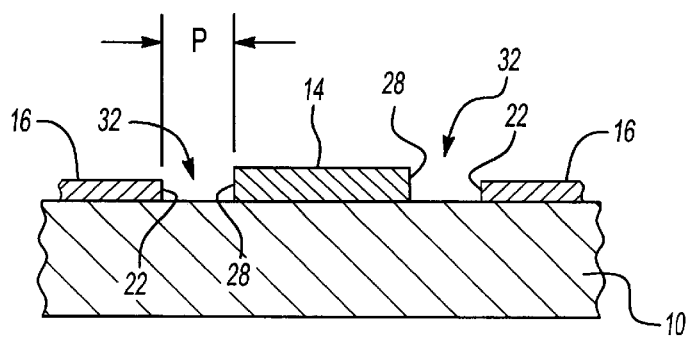
FIG. 2 is a section view of the PCB of FIG. 1 taken along line 2—2.
Figure 3:
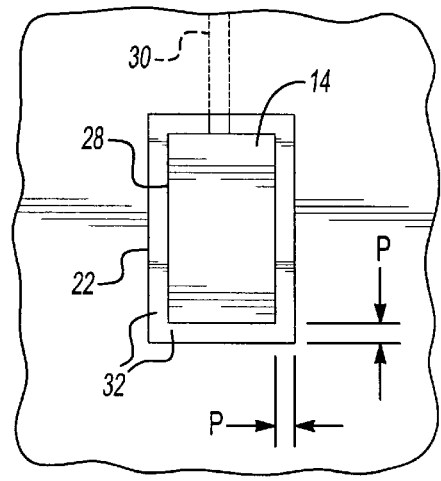
FIG. 3 is a plan view of the PCB of FIG. 1.
Figure 4:
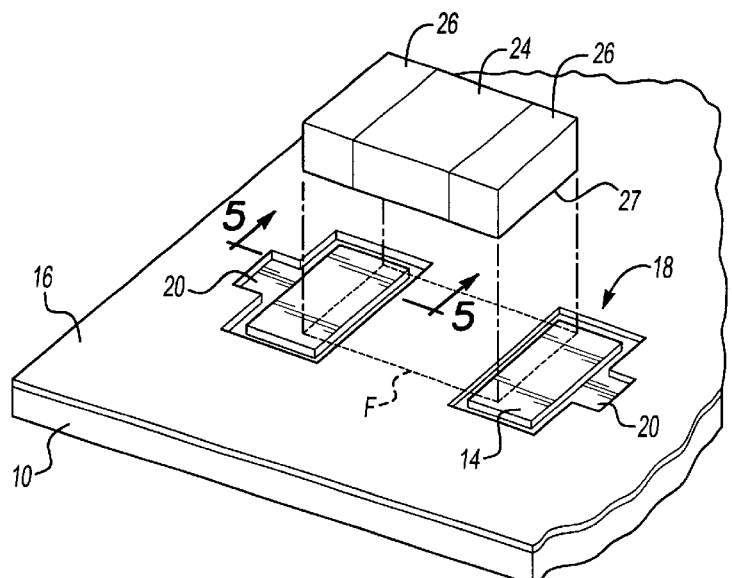
FIG. 4 is a perspective view of a PCB according to the present invention.
Figure 5:
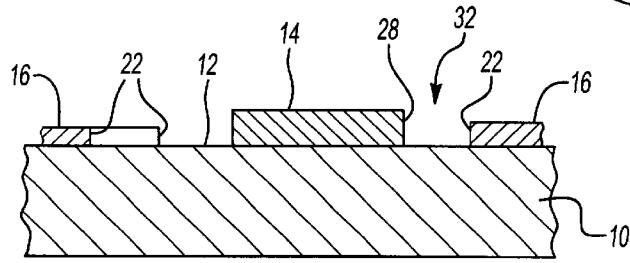
FIG. 5 is a section view of the PCB of FIG. 4 taken long line 5—5.
Figure 6:
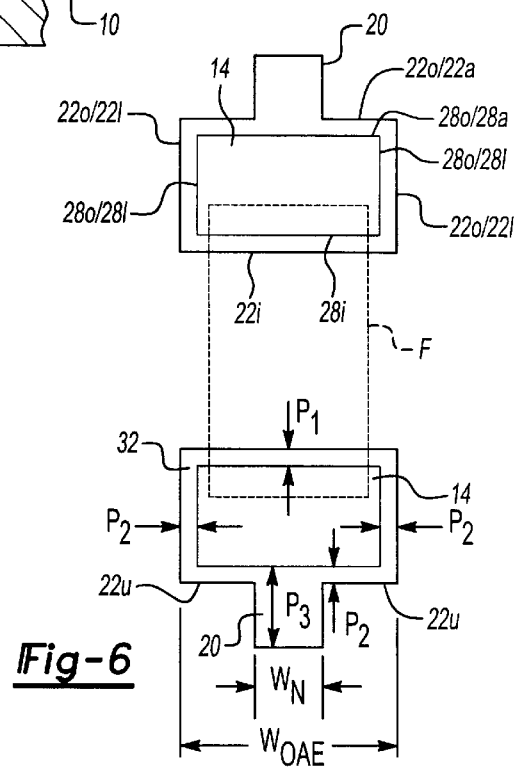
FIG. 6 is a plan view of the PCB of FIG. 4.

Referring now to the drawings, FIGS. 4–6 show a PCB having improved resistance against solder bridging and component decentering/tombstoning according to the present invention. The PCB comprises: a substrate 10 having a top surface 12; at least two mounting pads 14 disposed on the top surface in matched relation with terminations 26 of an electronic component 24; and a solder mask 16 disposed on the top surface and having at least two apertures 18 therethrough, wherein each aperture generally conforms in shape with and is arranged about a respective one of the mounting pads 14. Each aperture 18 has at least one inner aperture edge 22i generally within a projected footprint F of the electronic component and at least one outer aperture edge 22o generally outside the footprint F. Each aperture 18 includes a notch or relief 20 in one or more of the at least one outer aperture edge 22o, wherein each notch 20 extends generally outward from its respective mounting pad 14.

To assist the reader in understanding the present invention, all reference numbers used herein are summarized in the table below, along with the elements they represent:

10=Substrate
12=Top surface of substrate
14=Mounting pad
16=Solder mask
18=Aperture in solder mask
20=Notch in solder mask/aperture
20n=Neck portion of notch
22=Edges of aperture
22i=Inner aperture edge
22o=Outer aperture edge
22l=Lateral outer aperture edge
22a=Axial outer aperture edge
22u=Unnotched portions of outer aperture edge
24=Electronic component
26=Termination of electronic component
27=Bottom edge of component
28=Edges of mounting pad
28i=Inner edge of mounting pad
28o=Outer edge of mounting pad
28l=Lateral outer edge of mounting pad
28a=Axial outer edge of mounting pad
30=Circuit traces
32=Trough
40=Molten solder joint
P=Pullback of solder mask edge from pad edge
$P_1$=First predetermined distance between 22i and 28i
$P_2$=Second predetermined distance between 22o and 28o (excluding notch)
$P_3$=Depth of notch
F=Footprint of electronic component
$W_N$=Width of notch
$W_{OAE}$=Width of outer aperture edge having notch.

The substrate 10 may be a conventional flat, planar FR–4 glass/epoxy laminate; a semi-rigid to rigid plastic part (e.g., molded out of ABS or polypropylene); a flexible polyester, polyimide, or polyetherimide film; and so forth. The mounting pads 14 are typically rectangular or round copper pads and are formed on the substrate 10 by well-known plating and etching processes. The electronic component 24 is preferably a surface mount component (SMC) with two or more terminations 26 thereon. However, the mounting pads 14 may instead be plated through-holes or vias, which extend all the way through the substrate 10, and the component 24 may be a plated through-hole (PTH) component with two or more leads 26 extending outward therefrom.

As in the prior art, the solder mask 16 is a generally non-solder-wettable layer attached to the top surface 12 of the substrate 10. The mask 16 has two or more apertures 18 therein, wherein each aperture generally conforms in shape with, and is arranged about a respective one of, the mounting pads 14. For example, if a given mounting pad is rectangular, the corresponding aperture about this pad will be similarly rectangular (and usually, but not necessarily, larger in length and width than the pad).

As illustrated in FIGS. 4–6, each aperture 18 has at least one inner aperture edge 22i generally within a projected footprint F of the component 24. The footprint F generally conforms to the underside surface of the component 24 as projected onto the substrate top surface 12. Each aperture 18 also includes at least one outer aperture edge 22o generally outside the footprint F. Each inner aperture edge 22i is generally disposed along and proximate to a corresponding inner mounting pad edge 28i with a first predetermined distance or gap $P_1$ therebetween, while each outer aperture edge 22o is generally disposed along and proximate to a corresponding outer mounting pad edge 28o with a second predetermined distance or gap $P_2$ therebetween. Typically, pullback gaps $P_1$ and $P_2$ are the same as the corresponding prior art pullback measurements (i.e., 10–20 mils for screen-printed solder mask, and 0–5 mils for LPISM). The depth $P_3$ of each notch 20 from the adjacent mounting pad outer edge 28o is generally larger than $P_1$ and $P_2$, and may be sized depending on the notch shape chosen, the number and arrangement of notches per aperture, the effluence/volatility characteristics of the particular solder paste/processing scheme chosen, and so forth.

Figure 7:
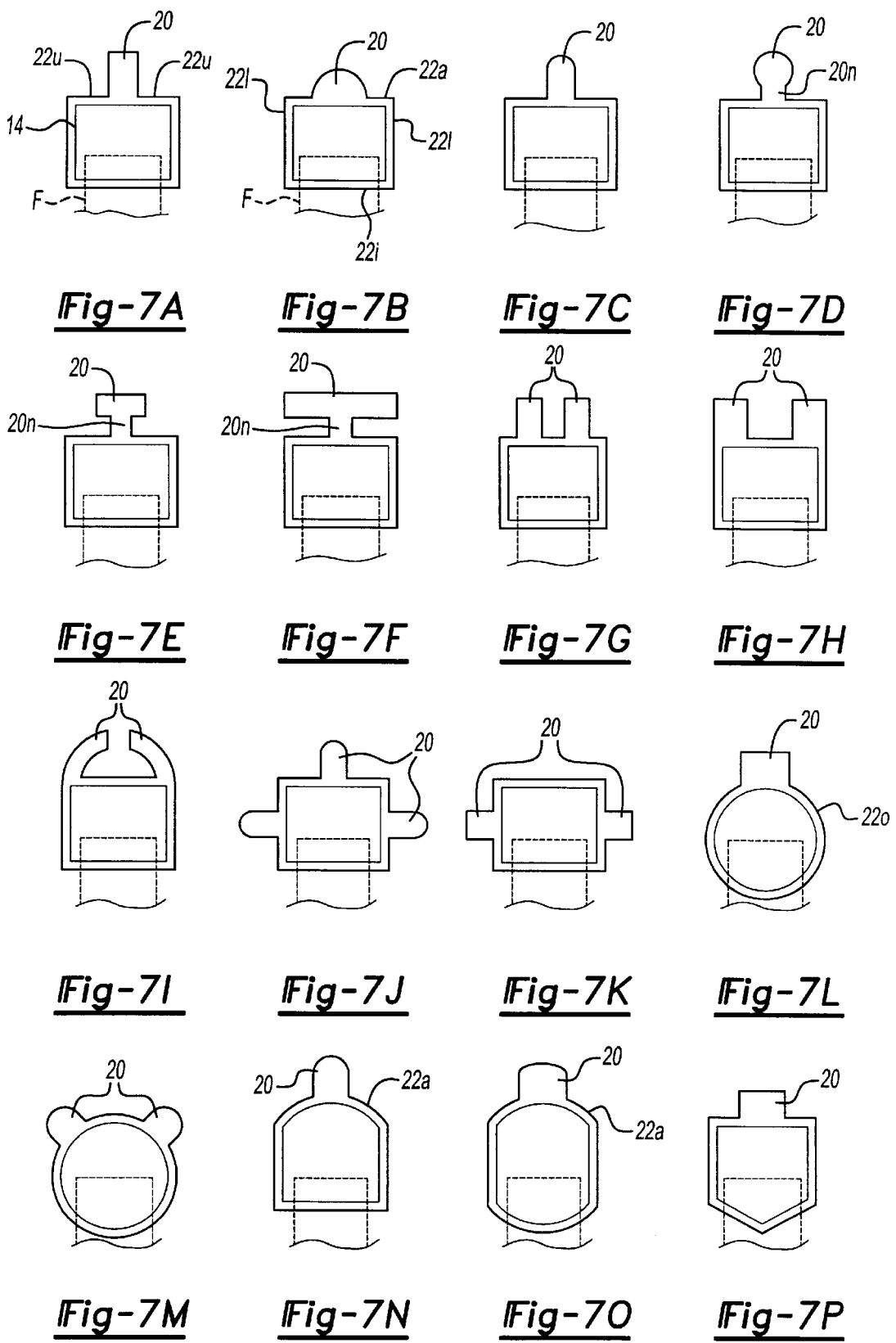
FIGS. 7A–T are plan views of various mounting pad/solder mask notch configurations according to the present invention.

Each aperture 18 further includes a notch or relief 20 in the solder mask/aperture 16/18, in one or more of the at least one outer aperture edge 22o. Each notch 20 extends generally outward from its respective mounting pad 14, and may be shaped generally rectangular, round, semi-circular, T-shaped, or in any other desired shape, as illustrated in FIGS. 7A–T. More than one notch may be used per aperture, and more than one notch can be formed in any given outer edge 22o of the aperture.

It is preferred that each notch 20 have a width $W_N$ no greater than about 80% of the width $W_{OAE}$ of the outer aperture edge 22o in which the notch is cut. If more than one notch is located in a given outer edge 22o (as in FIGS. 7G–I), then the combined width $\Sigma W_N$ of the notches therein should preferably not exceed about 80% of the outer edge width $W_{OAE}$. Alternatively, the notch 20 (or notches) in a given edge 22o may have an overall width greater than $W_{OAE}$, so long as each notch is provided with a smaller neck portion 20n, such that the combined width of all neck portions on that edge 22o is no greater than about 80% of $W_{OAE}$. In either case, the width of the notch/neck portion(s) is kept generally less than about 80% of the outer edge width so that sufficient solder mask is left unnotched, such that the molten solder surface tension forces between the bottom edge 27 of the component 24 and the unnotched portions 22u of the outer edge 22o keep the component from being pulled too far onto the mounting pad 14.

This can be more fully appreciated by referring to FIGS. 9A and 9B. In each of these figures, the width $W_N$ of the notch 20 is wider than recommended; in fact, in FIG. 9B, the width $W_N$ of the notch is equal to the width $W_{OAE}$ of the outer edge 22o. In such configurations, during reflow the effluents may cause enough of the unmasked substrate top surface 12 to wet such that the molten solder joint 40 and component 24 are pulled so far toward this unmasked and wetted surface that the component cannot form a sufficient solder joint at the opposite end. However, when enough of the outer aperture edge 22o is left unnotched 22u (i.e., each notch/neck portion is kept small enough), as in FIGS. 7A–T, then the surface tension forces are less prone to cause the aforementioned problem.

During reflow, the notch 20 provides a reservoir in the aperture about each mounting pad, into which the flux and other paste effluents—including solder balls—may flow and remain contained. This containment keeps the flux and other effluents from forming tracks or paths across the solder mask surface, which might otherwise promote or assist in the migration of solder balls and the formation of undesirable solder bridges. The aperture/notch configuration also assists in keeping flux, paste effluents, and solder balls away from the underside of the component 24, by providing each notch 20 in an outer edge 22o of the aperture 18. It is preferred that the notch(s) 20 be formed in an outer edge 22o rather than an inner edge 22i. If this were not the case—that is, if the notch(s) were instead formed in the inner edge 22i of the aperture within the footprint (i.e., underneath the device)—there may be a tendency for the component 24 to skate or float on the collected flux/effluents/solder balls, possibly resulting in an unacceptably decentered or tombstoned component. Also, if solder paste were channeled underneath the component, the gas ejection which normally occurs during reflow might be violent enough to cause or promote tombstoning of the component.

Two preferred embodiments are illustrated in the drawings, the first in FIGS. 4–6, 7A–F, 7L, and 7N–O, and the second in FIGS. 7R–T. In the first embodiment, the at least one outer aperture edge 22o may comprise either of two sub-embodiments: (1) a single outer aperture edge which is generally arcuate, as shown in FIG. 7L, or (2) two lateral outer aperture edges 22l each contiguous with an inner aperture edge 22i, and one axial outer aperture edge 22a contiguous with each of the two lateral edges 22l. In the latter sub-embodiment, the single axial outer edge 22a may be generally straight, as in the case of the generally rectangular outer aperture of FIGS. 7A–F, or it may be generally arcuate, as in FIGS. 7N–O. In either sub-embodiment, each aperture 18 includes only a single notch 20, wherein the notch is located generally along the middle of (1) the one outer aperture edge 22o (as in FIG. 7L) or (2) the one axial outer aperture edge 22a (as in FIGS. 7A–F and 7N–O).

In the second embodiment, the same two sub-embodiments are preferred (i.e., either (1) a single arcuate outer edge 22o, or (2) two lateral edges 22l and a single axial edge 22a). However, rather than a single notch located in the middle of the outer aperture, two notches are provided, wherein each notch is located on a respective side of the outer aperture flanking/proximate the component footprint F. These sub-embodiments are illustrated in FIGS. 7R—T.

In the first embodiment, the notch is positioned along the outer aperture at the farthest point away from the mounting pad/aperture inner edges 28i/22i. The purpose for locating the notch here is to provide the flux/effluent/solder ball reservoir 20 as far away from the component and the component underside as possible, so that any excess effluents/etc. are drawn away from where it could otherwise do the most damage. In the second embodiment, the notches 20 are placed on either side of the outer aperture right at the points where any excess effluents need to be drained away (i.e., right at the component bottom edge 27, so that the flux/effluents/solder balls may be kept from wicking underneath the component). Either embodiment serves the same purpose, but one embodiment might prove more effective for a given component, depending on the component dimensions, component weight, the termination dimensions, the materials involved (i.e., the solder, the termination metals, the component package material, and any coatings atop the mounting pads), the termination spacings, the proximity and layout of adjacent components, and so forth.

For applications involving fine-pitch, multiple-terminated components, it may be preferred to form the notch 20 in the axial outer edge 22a of the aperture, rather than in the lateral outer edges 22l, since there would generally be more available board space in the axial direction in which the relief's or notches may be formed. As illustrated by the SOIC arrangement in FIG. 8, between adjacent pads there is generally not as much available room in which to form notches as in the axial direction.

Although the present invention is preferably used with components having at least two terminations 26, the notched aperture configuration may also be utilized with components having only a single substrate-mounted termination. For example, a bare die power transistor has a single metallized bottom surface which serves as a termination, and two aluminum bond pads on the top surface of the die which also serve as terminations. The metallized bottom is typically soldered to a single substrate mounting pad (which may also serve as a heat sink for the component), while the two top bond pads may be wirebonded to an adjacent leadframe; thus, only a single mounting pad 14 is needed for such a device. Also, the footprint F of such a component would lie generally within the perimeter or edges 28 of the mounting pad, and the one or more notches 20 in the solder mask aperture 18 about the pad may extend outward in any direction, since any direction chosen will extend outward from the footprint F (and the pad 14). Thus, any single pad/aperture/notch arrangement shown in FIGS. 4 through 7T may be utilized with such a single-terminated component. The optimum size, shape, and number of notches 20 may be determined for a given component using the same factors mentioned previously for the two-or-more-termination case, and the orientation/direction of each notch would generally be chosen so as to not interfere with any adjacent components/pads/apertures.

Various other modifications to the present invention will, no doubt, occur to those skilled in the art to which the present invention pertains. For example, although reference is made herein to "solder", "solder paste", and "reflow" processing, the present invention applies equally to forming joints with conductive adhesive rather than solder paste, and optionally using a curing process (e.g., ultraviolet/infrared/laser radiation, exposure to hot air or other gases, etc.) rather than reflow processing. Also, it should be noted that no circuit traces are shown in FIGS. 4 et seq. (for the sake of clarity), although in actual practice the PCB would include a multiplicity of traces. Additionally, it should be apparent that it is preferred that notch(es) 20 not be placed atop or astraddle a circuit trace. Other modifications not specifically mentioned herein are also possible and within the scope of the present invention. It is the following claims, including all equivalents, which define the scope of the present invention.

What is claimed is:

1. A printed circuit board having improved resistance against solder bridging, comprising:
   a substrate having a top surface;
   at least two mounting pads disposed on said top surface in matched relation with terminations of an electronic component; and a solder mask disposed on said top surface and having at least two apertures therethrough, wherein each aperture generally conforms in shape with and is arranged about a respective one of said mounting pads, wherein each aperture has at least one inner aperture edge generally within a projected footprint of the electronic component and at least one outer aperture edge generally outside said footprint, wherein each aperture includes a notch in one or more of said at least one outer aperture edge, wherein each notch extends generally outward from its respective mounting pad, said notch having an upper surface defined by said solder mask and a bottom surface defined by said top surface of said substrate.

2. A printed circuit board according to claim 1, wherein each mounting pad is generally round or generally rectangular.

3. A printed circuit board according to claim 1, wherein each notch is generally rectangular, round, semi-circular, or T-shaped.

4. A printed circuit board according to claim 1, wherein each notch has a width $W_N$, and each outer aperture edge having a notch therein has a width $W_{OAE}$, wherein $\Sigma W_N \leq 0.8\ W_{OAE}$ for each outer aperture edge having a notch therein.

5. A printed circuit board according to claim 1, wherein:
(a) said at least one outer aperture edge comprises:
 (i) only one outer aperture edge, wherein said one outer aperture edge is generally arcuate;
(b) wherein each aperture includes only one notch, wherein the notch is located generally along the middle of said one outer aperture edge.

6. A printed circuit board according to claim 1, wherein:
(a) said at least one outer aperture edge comprises:
 (i) two lateral outer aperture edges each contiguous with an inner aperture edge, and
 (ii) one axial outer aperture edge contiguous with each of the two lateral outer aperture edges;
(b) wherein each aperture includes only one notch, wherein the notch is located generally along the middle of said one axial outer aperture edge.

7. A printed circuit board according to claim 1, wherein:
(a) said at least one outer aperture edge comprises:
 (i) only one outer aperture edge, wherein said one outer aperture edge is generally arcuate;
(b) wherein each aperture includes only two notches, wherein each notch is located on a respective end of said one outer aperture edge proximate said footprint.

8. A printed circuit board according to claim 1, wherein:
(a) said at least one outer aperture edge comprises:
 (i) two lateral outer aperture edges each contiguous with an inner aperture edge, and
 (ii) one axial outer aperture edge contiguous with each of the two lateral outer aperture edges;
(b) wherein each aperture includes only two notches, wherein each notch is located in a respective one of said two lateral outer aperture edges proximate said footprint.

9. A printed circuit board having improved resistance against solder bridging, comprising:
a substrate having a top surface;
at least two mounting pads disposed on said top surface in matched relation with terminations of an electronic component; and
a solder mask disposed on said top surface and having at least two apertures therethrough, wherein each aperture generally conforms in shape with and is arranged about a respective one of said mounting pads, wherein each aperture has at least one inner aperture edge generally within a projected footprint of the electronic component and at least one outer aperture edge generally outside said footprint, wherein each aperture includes a notch in one or more of said at least one outer aperture edge, wherein each notch extends generally outward from its respective mounting pad, said notch having an upper surface defined by said solder mask and a bottom surface defined by said top surface of said substrate, wherein each notch has a width $W_N$, and each outer aperture edge having a notch therein has a width $W_{OAE}$, wherein $\Sigma W_N \leq 0.8\ W_{OAE}$ for each outer aperture edge having a notch therein.

10. A printed circuit board according to claim 9, wherein each mounting pad is generally round or generally rectangular.

11. A printed circuit board according to claim 9, wherein each notch is generally rectangular, round, semi-circular, or T-shaped.

12. A printed circuit board according to claim 9, wherein
(a) said at least one outer aperture edge comprises:
 (i) only one outer aperture edge, wherein said one outer aperture edge is generally arcuate;
(b) wherein each aperture includes only one notch, wherein the notch is located generally along the middle of said one outer aperture edge.

13. A printed circuit board according to claim 9, wherein
(a) said at least one outer aperture edge comprises:
 (i) two lateral outer aperture edges each contiguous with an inner aperture edge, and
 (ii) one axial outer aperture edge contiguous with each of the two lateral outer aperture edges;
(b) wherein each aperture includes only one notch, wherein the notch is located generally along the middle of said one axial outer aperture edge.

14. A printed circuit board according to claim 9, wherein
(a) said at least one outer aperture edge comprises:
 (i) only one outer aperture edge, wherein said one outer aperture edge is generally arcuate;
(b) wherein each aperture includes only two notches, wherein each notch is located on a respective end of said one outer aperture edge proximate said footprint.

15. A printed circuit board according to claim 9, wherein
(a) said at least one outer aperture edge comprises:
 (i) two lateral outer aperture edges each contiguous with an inner aperture edge, and
 (ii) one axial outer aperture edge contiguous with each of the two lateral outer aperture edges;
(b) wherein each aperture includes only two notches, wherein each notch is located in a respective one of said two lateral outer aperture edges proximate said footprint.

16. A printed circuit board having improved resistance against solder bridging, comprising:
(a) a substrate having a top surface;
(b) at least two mounting pads disposed on said top surface in matched relation with terminations of an electronic component; and
(c) a solder mask disposed on said top surface and having at least two apertures therethrough, wherein each aperture generally conforms in shape with and is arranged about a respective one of said mounting pads, wherein each aperture has:

(i) at least one inner aperture edge generally within a projected footprint of the electronic component,
(ii) two lateral outer aperture edges generally outside of the footprint, and
(iii) an axial outer aperture edge contiguous with each of the two lateral outer aperture edges;

(d) wherein each aperture includes a notch in one or more of said outer aperture edges, wherein each notch extends generally outward from its respective mounting pad, said notch having an upper surface defined by said solder mask and a bottom surface defined by said top surface of said substrate;

(e) wherein each notch has a width $W_N$, and each outer aperture edge having a notch therein has a width $W_{OAE}$, wherein $\Sigma W_N \leq 0.8\ W_{OAE}$.

17. A printed circuit board according to claim 16, wherein each aperture includes only one notch, wherein the notch is located generally along the middle of said axial outer aperture edge.

18. A printed circuit board according to claim 16, wherein each aperture includes first and second notches, wherein each notch is located in a respective one of said two lateral outer aperture edges proximate said footprint.

19. A printed circuit board according to claim 18, further including a third notch located generally along the middle of said axial outer aperture edge.

20. A printed circuit board according to claim 16, wherein each notch is generally rectangular, round, semi-circular, or T-shaped.

* * * * *